US010429451B2

United States Patent
Kim et al.

(10) Patent No.: US 10,429,451 B2
(45) Date of Patent: Oct. 1, 2019

(54) APPARATUS FOR TESTING LUMINAIRE BASED ON USB AND METHOD USING THE SAME

(71) Applicant: Electronics and Telecommunications Research Institute, Daejeon (KR)

(72) Inventors: You-Jin Kim, Daejeon (KR); Hyun-Seok Kim, Daejeon (KR); Tae-Gyu Kang, Daejeon (KR); Dae-Ho Kim, Daejeon (KR); Seong-Hee Park, Daejeon (KR); Jung-Sik Sung, Daejeon (KR); Ji-Hun Jeon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 184 days.

(21) Appl. No.: 15/478,835

(22) Filed: Apr. 4, 2017

(65) Prior Publication Data

US 2017/0293000 A1    Oct. 12, 2017

(30) Foreign Application Priority Data

Apr. 8, 2016    (KR) .................. 10-2016-0043313

(51) Int. Cl.
  *G01R 31/44*    (2006.01)
  *H05B 33/08*    (2006.01)
  (Continued)

(52) U.S. Cl.
  CPC .............. *G01R 31/44* (2013.01); *G06F 11/00* (2013.01); *H05B 33/0884* (2013.01); *H05B 37/03* (2013.01)

(58) Field of Classification Search
  CPC ............ G01R 31/2632; G01R 31/2635; G01R 31/44; H05B 33/08; H05B 33/0803; H05B 33/0884; H05B 37/03–038
  See application file for complete search history.

(56) References Cited

U.S. PATENT DOCUMENTS 7,064,832 B2 *   6/2006   Rogers ...................... G01J 1/42
                                                              250/226
7,382,148 B2 *   6/2008   Dang .................. G01R 31/2635
                                                              324/762.07
(Continued)

FOREIGN PATENT DOCUMENTS

KR   1020110123652 A   11/2011
KR   2020110011920 U   12/2011
(Continued)

*Primary Examiner* — Huy Q Phan
*Assistant Examiner* — David B Frederiksen
(74) *Attorney, Agent, or Firm* — William Park & Associates Ltd.

(57) ABSTRACT

Disclosed are an apparatus and method for testing a luminaire based on USB. The apparatus for testing a luminaire based on USB includes a power measurement unit for measuring power consumption by measuring power input from a host system to a luminaire based on USB; a message interpretation unit for generating a result of interpretation of a message based on a USB-based control message sent and received between the host system and the luminaire; an illuminance reception unit for receiving a result of measurement of illuminance of the luminaire, measured by a light reception device; and an information generation unit for generating test result information based on a result of the measurement of the power consumption, the result of the interpretation of the message, and the result of the measurement of the illuminance.

10 Claims, 7 Drawing Sheets

(51) Int. Cl.
*G06F 11/00* (2006.01)
*H05B 37/03* (2006.01)

(56) References Cited

U.S. PATENT DOCUMENTS

| | | | | |
|---|---|---|---|---|
| 7,782,450 | B2* | 8/2010 | Liu | H04M 1/24 356/213 |
| 2001/0048409 | A1* | 12/2001 | Kim | F21V 21/32 345/82 |
| 2009/0222223 | A1* | 9/2009 | Walters | G01R 31/44 702/58 |
| 2010/0141266 | A1* | 6/2010 | Cui | G01R 31/30 324/538 |
| 2011/0241691 | A1* | 10/2011 | Hsu | G01R 31/2635 324/414 |
| 2011/0276289 | A1 | 11/2011 | Park et al. | |
| 2012/0158302 | A1* | 6/2012 | Zhu | G01J 1/0219 702/1 |
| 2014/0306609 | A1 | 10/2014 | Kang et al. | |
| 2015/0173156 | A1* | 6/2015 | Pedersen | H05B 37/0272 315/151 |
| 2015/0230322 | A1 | 8/2015 | Kim et al. | |

FOREIGN PATENT DOCUMENTS

| | | |
|---|---|---|
| KR | 1020120014272 A | 2/2012 |
| KR | 1020130087271 A | 8/2013 |
| KR | 1020130110267 A | 10/2013 |
| KR | 101457200 B1 | 10/2014 |
| KR | 200475227 Y1 | 11/2014 |
| KR | 101579249 B1 | 12/2015 |

* cited by examiner

APPARATUS FOR TESTING LUMINAIRE BASED ON USB AND METHOD USING THE SAME

CROSS REFERENCE TO RELATED APPLICATION

This application claims the benefit of Korean Patent Application No. 10-2016-0043313, filed Apr. 8, 2016, which is hereby incorporated by reference in its entirety into this application.

BACKGROUND OF THE INVENTION

1. Technical Field

The present invention relates to technology for testing a luminaire based on USB.

2. Description of the Related Art

The International Electrotechnical Commission (IEC), which is an international organization for standardization, has released IEC 62680, pertaining to USB standards. LED luminaires equipped with USB plug ports are being produced.

A conventional USB testing device functions to analyze control messages (including data) while supplying power via USB. However, because an LED luminaire equipped with a USB plug port includes a light emission unit, a separate device for measuring the illuminance thereof is required.

Because the conventional USB testing device is separate from the device for measuring illuminance, it is problematic in that it is difficult to simultaneously perform the analysis of control messages including data, the measurement of power consumption, the measurement of illuminance, and the like.

Particularly, when illuminance is changed based on a control message (including data) from a USB host system (i.e., a device functioning as a USB host, such as a desktop PC, a laptop, a smart device, a USB power supply device, or the like), it is problematic in that power consumption and illuminance cannot be measured at the same time.

Meanwhile, Korean Patent No. 10-1579249, titled "Testing system of image display device and test jig used therein" discloses a system for testing the performance of an image display device and the provision of a test jig used for the test, the system being configured such that a unit for testing the performance of an image display device is not directly connected with the image display device but is connected with the USB Type-C port of the image display device via a test jig, whereby the USB Type-C port of the image display device may be prevented from being damaged.

SUMMARY OF THE INVENTION

An object of the present invention is to simultaneously perform the measurement of power consumption, the interpretation of a control message, and the measurement of illuminance of a USB-based luminaire connected with a host system.

Another object of the present invention is to incorporate the state of a luminaire, changed based on a control message, in a test result in real time.

A further object of the present invention is to simultaneously display the test start time, power consumption, the result of interpretation of a message, and the result of measurement of illuminance on a single screen through an interface of a user terminal device.

In order to accomplish the above objects, an apparatus for testing a luminaire based on USB according to an embodiment of the present invention includes a power measurement unit for measuring power consumption by measuring power input from a host system to a luminaire based on USB; a message interpretation unit for generating a result of interpretation of a message based on a USB-based control message sent and received between the host system and the luminaire; an illuminance reception unit for receiving a result of measurement of illuminance of the luminaire, measured by a light reception device; and an information generation unit for generating test result information based on a result of the measurement of the power consumption, the result of the interpretation of the message, and the result of the measurement of the illuminance.

Here, the power measurement unit may measure the power consumption based on a voltage and a current that are supplied from the host system through a USB plug and are then input to the luminaire through a USB receptacle.

Here, the message interpretation unit may generate the result of the interpretation of the message by interpreting the control message extracted from USB data, which are sent to and received from the host system through the USB plug, and which are sent to and received from the luminaire through the USB receptacle.

Here, the information generation unit may collect the result of the measurement of the power consumption, the result of the interpretation of the message, and the result of the measurement of the illuminance corresponding to test start time information based on a test start command received from a user terminal device.

Here, the information generation unit may generate the test result information such that the test start time information, the result of the measurement of the power consumption, the result of the interpretation of the message, and the result of the measurement of the illuminance are displayed on a screen of an interface of the user terminal device.

Here, the information generation unit may generate the test result information based on a communication method corresponding to a communication method of the user terminal device.

Also, in order to accomplish the above objects, a method for testing a luminaire based on USB, in which an apparatus for testing a luminaire based on USB is used, according to an embodiment of the present invention includes measuring power consumption by measuring power input from a host system to a luminaire based on USB; generating a result of interpretation of a message based on a USB-based control message sent and received between the host system and the luminaire; receiving a result of measurement of illuminance of the luminaire, measured by a light reception device; and generating test result information based on a result of the measurement of the power consumption, the result of the interpretation of the message, and the result of the measurement of the illuminance.

Here, measuring the power consumption may be configured to measure the power consumption based on a voltage and a current that are supplied from the host system through a USB plug and are then input to the luminaire through a USB receptacle.

Here, generating the result of the interpretation of the message may be configured to generate the result of the interpretation of the message by interpreting the control message extracted from USB data, which are sent to and received from the host system through the USB plug, and which are sent to and received from the luminaire through the USB receptacle.

Here, generating the test result information may be configured to collect the result of the measurement of the power consumption, the result of the interpretation of the message, and the result of the measurement of the illuminance corresponding to test start time information based on a test start command received from a user terminal device.

Here, generating the test result information may be configured to generate the test result information based on a communication method corresponding to a communication method of the user terminal device.

Here, generating the test result information may be configured to display the test start time information, the result of the measurement of the power consumption, the result of the interpretation of the message, and the result of the measurement of the illuminance on a screen of an interface of the user terminal device.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
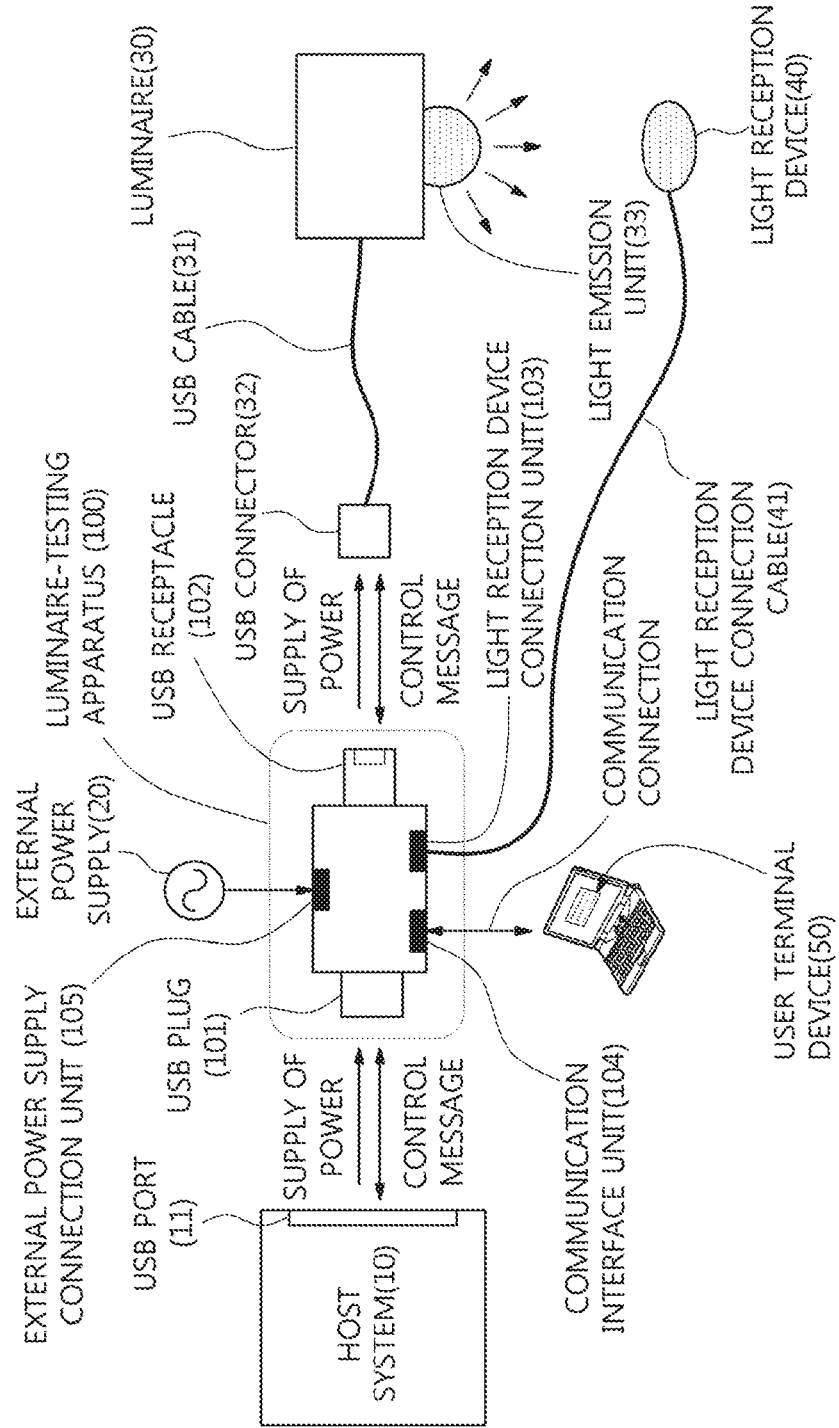
FIG. 1 is a view that shows components for testing a USB-based luminaire according to an embodiment of the present invention.

The present invention will be described in detail below with reference to the accompanying drawings. Repeated descriptions and descriptions of known functions and configurations which have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated in order to make the description clearer.

Hereinafter, a preferred embodiment according to the present invention will be described in detail with reference to the accompanying drawings.

FIG. 1 is a view that shows components for testing a USB-based luminaire according to an embodiment of the present invention.

Referring to FIG. 1, the components for testing a USB-based luminaire include a host system 10, an external power supply 20, a luminaire 30, a light reception device 40, a user terminal device 50 and a luminaire-testing apparatus 100.

The luminaire-testing apparatus 100 may include a USB plug 101, a USB receptacle 102, a light reception device connection unit 103, a communication interface unit 104, and an external power supply connection unit 105.

The host system 10 may be a device that functions as a USB host, such as a desktop PC, a laptop, a smart device, a USB power supply device, or the like.

The host system 10, including a USB port 11, may be connected with the USB plug 101 of the luminaire-testing apparatus 100. Here, the host system 10 may supply power to the luminaire 30, and may send and receive data via the luminaire-testing apparatus 100 through the USB plug 101.

Here, the host system 10 may send data including a control message for controlling the illuminance of the luminaire 30.

The external power supply 20 may supply power for driving the luminaire-testing apparatus 100. Here, the external power supply 20 may supply power by being connected with the external power supply connection unit 105 of the luminaire-testing apparatus 100.

The luminaire 30 may be a USB-based luminaire, such as an LED luminaire or the like. The luminaire may include a USB cable 31, a USB connector 32, and a light emission unit 33.

Here, the luminaire 30 may be connected with the USB receptacle 102 of the luminaire-testing apparatus 100. Here, the luminaire 30 may be supplied with power and send and receive data through the USB connector 32, which is connected with the USB receptacle 102.

Here, the luminaire 30 may control the illuminance of the light emission unit 33 based on the input power and the control message included in the received data.

The light reception device 40 may connect a light reception device connection cable 41, which transmits an electronic signal, converted from an optical signal, with the light reception device connection unit 103 of the luminaire-testing apparatus 100. Here, the light reception device 40 may measure the illuminance of the light emission unit 33 of the luminaire 30, and may send the result of the measurement of the illuminance to the luminaire-testing apparatus 100.

The user terminal device 50 may be connected with the luminaire-testing apparatus 100 in a wired or wireless manner. When they are connected in a wired manner, the user terminal device 50 may be connected with the communication interface unit 104 of the luminaire-testing apparatus 100 using a communication cable. When they are wirelessly connected, the user terminal device 50 may communicate with the luminaire-testing apparatus 100 using any of various wireless communication standards, such as wireless USB, wireless Ethernet, CAN, Wi-Fi, ZigBee, Z-Wave, Bluetooth, or the like. The user terminal device 50 may be a terminal device including an input/output interface, such as a desktop PC, a laptop, a smartphone, or the like.

Here, the user terminal device 50 may send a command for instructing the luminaire-testing apparatus 100 to start a test. The command may include test requirements and various configuration information set by a user.

Here, the user terminal device 50 may receive test result information generated by the luminaire-testing apparatus 100. The test result information may include information about the test start time and the measurement of power consumption, the interpretation of the control message, and the measurement of illuminance corresponding to the test start time. Here, the user terminal device 50 may output the test start time information, the result of measurement of power consumption, the result of interpretation of the message, and the result of measurement of illuminance, included in the test result information, through an interface. Here, the luminaire-testing apparatus 100 may generate the test result information based on a communication method corresponding to the communication method of the user terminal device 50.

Here, the user terminal device 50 may simultaneously display the test start time information, the result of measurement of power consumption, the result of interpretation of the message, and the result of measurement of illuminance on a single screen of the interface of the user terminal device 50, and may incorporate information that changes in real time.

Figure 2:
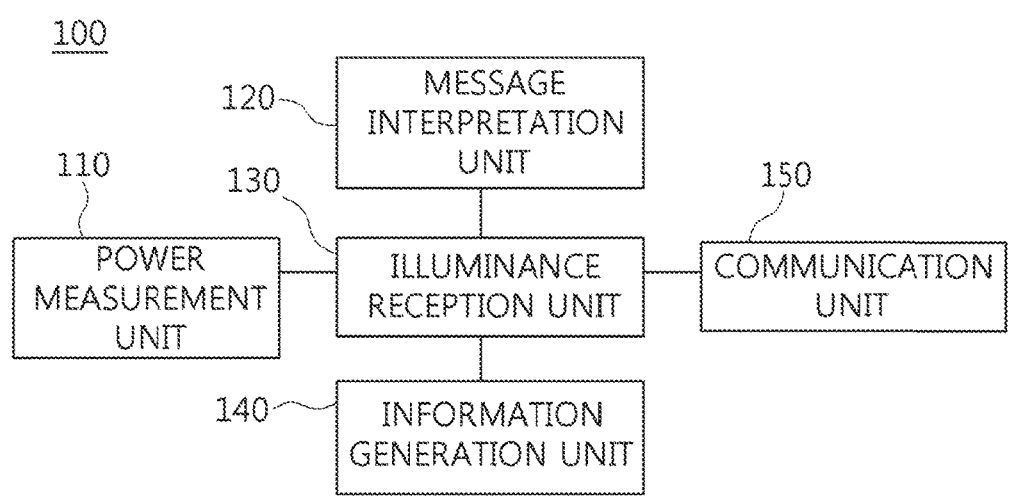
FIG. 2 is a block diagram that shows an example of the apparatus for testing a USB-based luminaire, illustrated in FIG. 1.

FIG. 2 is a block diagram that shows an example of the apparatus for testing a USB-based luminaire, illustrated in FIG. 1.

Referring to FIG. 2, the apparatus for testing a USB-based luminaire includes a power measurement unit 110, a message interpretation unit 120, an illuminance reception unit 130, an information generation unit 140, and a communication unit 150.

The power measurement unit 110 may measure power consumption by measuring the power input from the host system 10 to the luminaire 30. Here, the power measurement unit 110 may measure power consumption based on the voltage and current that are supplied from the host system 10 through the USB plug 101 and are then input to the luminaire 30 through the USB receptacle 102.

Here, the power measurement unit 110 may deliver information about the measured power consumption to the information generation unit 140.

The message interpretation unit 120 may generate a result of interpretation of a message based on a USB-based control message, sent and received between the host system 10 and the luminaire 30. Here, the message interpretation unit 120 may generate the result of interpretation of the message by interpreting a control message extracted from USB data, which are sent to and received from the host system 10 through the USB plug 101, and which are sent to and received from the luminaire 30 through the USB receptacle 102.

Here, the message interpretation unit 120 may check whether a control message is received. When a control message is received by the luminaire-testing apparatus 100, the message interpretation unit 120 may generate a result of interpretation of a message based on the received control message. When no control message is received by the luminaire-testing apparatus 100, a result of interpretation of the message may not be generated.

Here the message interpretation unit 120 may deliver the generated result of interpretation of the message to the information generation unit 140.

The illuminance reception unit 130 may receive a result of the measurement of the illuminance of the luminaire 30, which is measured by the light reception device 40. Here, the illuminance reception unit 130 may deliver the received result of the measurement of the illuminance to the information generation unit 140.

The information generation unit 140 may generate test result information based on the test start command, the result of measurement of power consumption, the result of interpretation of the message, and the result of measurement of illuminance. The test result information may include the test start time information and the measurement of power consumption, the interpretation of the control message, and the measurement of illuminance corresponding to the test start time information. The test start time may be the time at which the test start command is received.

Here, the information generation unit 140 may generate the test result information such that the test start time information, the result of measurement of power consumption, the result of interpretation of the message, and the result of measurement of illuminance are displayed on the screen of the interface of the user terminal device 50.

Here, the information generation unit 140 may generate the test result information such that the test start time information, the result of measurement of power consumption, the result of interpretation of the message, and the result of measurement of illuminance are simultaneously displayed on a single screen of the interface of the user terminal device 50.

Here, the information generation unit 140 may generate the test result information based on a communication method corresponding to the communication method of the user terminal device 50.

The communication unit 150 may be connected with the user terminal device 50 in a wired or wireless manner. When they are connected in a wired manner, the communication unit 150 may communicate with the user terminal device 50 using a communication cable. When they are wirelessly connected, the communication unit 150 may communicate with the user terminal device 50 using any of various wireless communication standards, such as wireless USB, wireless Ethernet, CAN, Wi-Fi, ZigBee, Z-Wave, Bluetooth, and or the like.

Here, the communication unit 150 may receive a test start command from the user terminal device 50. The test start command may include test requirements and various configuration information set by a user.

Here, the communication unit 150 may send the test result information, generated by the luminaire-testing apparatus 100, to the user terminal device 50. Here, the user terminal device 50 may output the test start time information, the result of measurement of power consumption, the result of interpretation of the message, and the result of measurement of illuminance, included in the test result information, through an interface.

Here, the user terminal device 50 may simultaneously display the test start time information, the result of measurement of power consumption, the result of interpretation of the message, and the result of measurement of illuminance on a single screen of the interface, and may incorporate information that changes in real time. Here, the user terminal device 50 may be a terminal device that includes an input/output interface, such as a desktop PC, a laptop, a smartphone, or the like.

Figure 3:
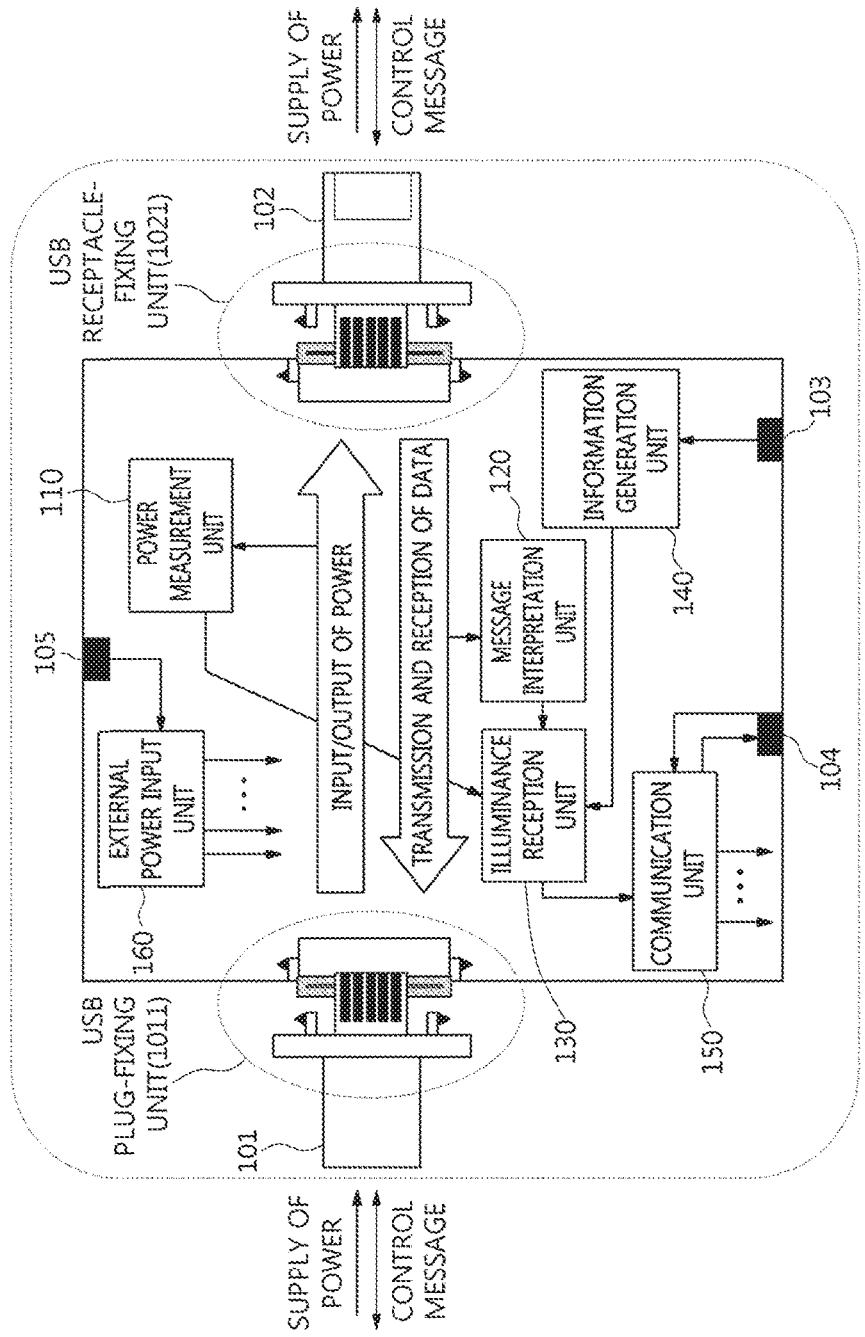
FIG. 3 is a view that specifically shows an example of the apparatus for testing a USB-based luminaire, illustrated in FIG. 1.

FIG. 3 is a view that specifically shows an example of the apparatus for testing a USB-based luminaire, illustrated in FIG. 1.

Referring to FIG. 3, it can be confirmed that an example of the apparatus 100 for testing a USB-based luminaire is specifically illustrated.

The luminaire-testing apparatus 100 may include a USB plug 101, a USB plug-fixing unit 1011, a USB receptacle 102, a USB receptacle-fixing unit 1021, a light reception device connection unit 103, a communication interface unit 104, an external power supply connection unit 105, a power measurement unit 110, a message interpretation unit 120, an illuminance reception unit 130, an information generation unit 140, a communication unit 150, and an external power input unit 160.

The USB plug 101 may include the detachable USB plug-fixing unit 1011 in order to support all USB plug types defined in the IEC 62680 standards. Here, the USB plug 101 may be connected with the USB port 11 of the host system 10.

The USB receptacle 102 may include the detachable USB receptacle-fixing unit 1021 in order to support all USB plug types defined in the IEC 62680 standards. Here, the USB receptacle 102 may be connected with the USB connector 32 of the luminaire 30.

Here, the power input from the host system 10 goes through a power input/output process through the USB plug 101, and may then be supplied to the luminaire 30 via the USB receptacle 102.

Here, data received from the host system 10 goes through a data transmission and reception process through the USB plug 101, and may then be sent to the luminaire 30 via the USB receptacle 102.

Here, the data may include a control message through which the host system 10 may control the luminaire 30. For example, the control message may be a message for controlling the illuminance of the light emission unit 33 of the luminaire 30.

The external power supply connection unit 105 may be connected with the external power supply 20 in order to be supplied with the power from the external power supply 20.

The external power input unit 160 may deliver the power, which is received from the external power supply 20 via the external power supply connection unit 105, to the respective components of the luminaire-testing apparatus 100.

That is, the power input from the host system 10 may be used to drive the luminaire 30, and the power input from the external power supply 20 may be used to drive the luminaire-testing apparatus 100.

The power measurement unit 110 may measure power consumption by measuring the power input from the host system 10 to the luminaire 30. Here, the power measurement unit 110 may measure power consumption based on the voltage and current that are supplied from the host system 10 through the USB plug 101 and are then input to the luminaire 30 through the USB receptacle 102.

Here, the power measurement unit 110 may deliver information about the measured power consumption to the information generation unit 140.

The message interpretation unit 120 may generate a result of interpretation of a message based on a USB-based control message, sent and received between the host system 10 and the luminaire 30. Here, the message interpretation unit 120 may generate the result of interpretation of the message by interpreting a control message extracted from USB data, which are sent to and received from the host system 10 through the USB plug 101, and which are sent to and received from the luminaire 30 through the USB receptacle 102.

Here, the message interpretation unit 120 may check whether a control message is received. When a control message is received by the luminaire-testing apparatus 100, the message interpretation unit 120 may generate a result of interpretation of the message based on the received control message. When no control message is received by the luminaire-testing apparatus 100, a result of interpretation of the message may not be generated.

Here the message interpretation unit 120 may deliver the generated result of interpretation of the message to the information generation unit 140.

The light reception device connection unit 103 may be connected with the light reception device 40 through a light reception device connection cable 41, which transmits an electronic signal, converted from an optical signal. The light reception device 40 measures the illuminance of the light emission unit 33 of the luminaire 30, and may send the result of measurement of the illuminance to the luminaire-testing apparatus 100 through the light reception device connection cable 41.

The illuminance reception unit 130 may receive the result of measurement of illuminance of the luminaire 30, which is measured by the light reception device 40. Here, the illuminance reception unit 130 may deliver the received result of measurement of illuminance to the information generation unit 140.

The information generation unit 140 may generate test result information based on the result of measurement of power consumption, the result of interpretation of the message, and the result of measurement of illuminance. The test result information may include the test start time information and the measurement of power consumption, the interpretation of the control message, and the measurement of illuminance corresponding to the test start time information. The test start time may be the time at which the test start command is received.

Here, the information generation unit 140 may generate the test result information such that the test start time information, the result of measurement of power consumption, the result of interpretation of the message, and the result of measurement of illuminance are displayed on the screen of the interface of the user terminal device 50.

Here, the information generation unit 140 may generate the test result information such that the test start time information, the result of measurement of power consumption, the result of interpretation of the message, and the result of measurement of illuminance are simultaneously displayed on a single screen of the interface of the user terminal device 50.

Here, the information generation unit 140 may generate the test result information based on a communication method corresponding to the communication method of the user terminal device 50.

When a wired communication method is used, the communication interface unit 104 may be connected with the user terminal device 50 using a communication cable. When they are wirelessly connected, the user terminal device 50 may communicate with the luminaire-testing apparatus 100 using any of various wireless communication standards, such as wireless USB, wireless Ethernet, CAN, Wi-Fi, ZigBee, Z-Wave, Bluetooth, or the like.

The communication unit 150 may be connected with the user terminal device 50 in a wired or wireless manner. When they are connected in a wired manner, the communication unit 150 may communicate with the user terminal device 50 using a communication cable. When they are wirelessly connected, the communication unit 150 may communicate with the user terminal device 50 using any of various wireless communication standards, such as wireless USB, wireless Ethernet, CAN, Wi-Fi, ZigBee, Z-Wave, Bluetooth, or the like.

Here, the communication unit 150 may receive a test start command from the user terminal device 50. The test start command may include test requirements and various configuration information set by a user.

Here, the communication unit 150 may send the test result information, generated by the luminaire-testing apparatus 100, to the user terminal device 50. Here, the user terminal device 50 may output the test start time information, the result of measurement of power consumption, the result of interpretation of the message, and the result of measurement of illuminance, included in the test result information, through an interface. Here, the user terminal device 50 may be a terminal device including an input/output interface, such as a desktop PC, a laptop, a smartphone, or the like.

Figure 4:
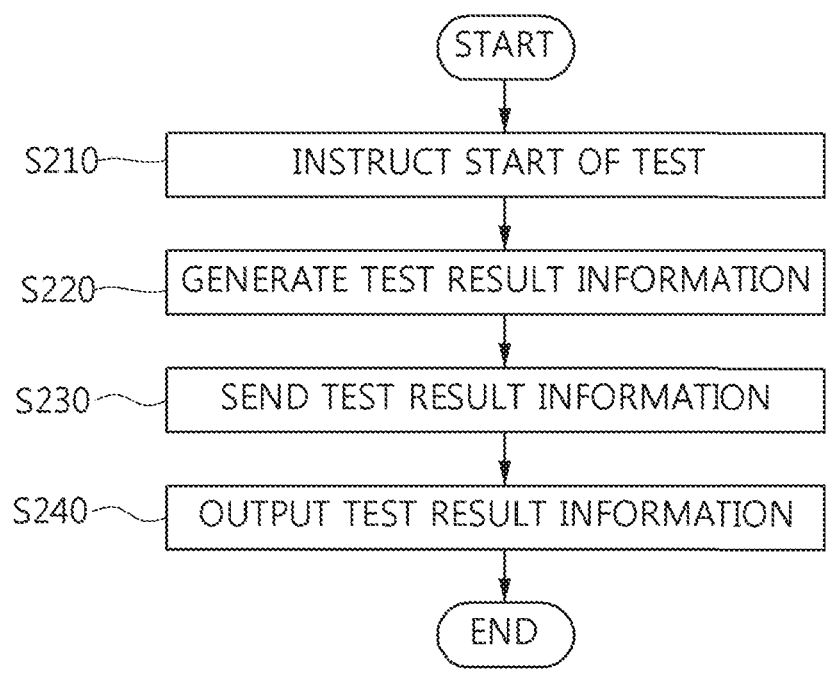
FIG. 4 is a flowchart that shows a method for testing a USB-based luminaire according to an embodiment of the present invention.

FIG. 4 is a flowchart that shows a method for testing a USB-based luminaire according to an embodiment of the present invention.

Referring to FIG. 4, in the method for testing a USB-based luminaire according to an embodiment of the present invention, first, commencement of a test is instructed at step S210.

That is, at step S210, the user terminal device 50 may send a test start command to the luminaire-testing apparatus 100. The test start command may include test requirements and various configuration information set by a user.

Here, at step S210, the test start command is received from the user terminal device 50 in a wired or wireless manner. When the connection is made in a wired manner, the luminaire-testing apparatus may communicate with the user terminal device 50 using a communication cable. When the connection is made in a wireless manner, the luminaire-testing apparatus may communicate with the user terminal device 50 using any of various wireless communication standards, such as wireless USB, wireless Ethernet, CAN, Wi-Fi, ZigBee, Z-Wave, Bluetooth, or the like.

Also, in the method for testing a USB-based luminaire, test result information may be generated at step S220.

That is, at step S220, first, power consumption may be measured at step S221.

Here, at step S221, power consumption may be measured by measuring the power input from the host system 10 to the luminaire 30. Here, at step S221, the power consumption may be measured based on the voltage and current that are supplied from the host system 10 through the USB plug 101 and are then input to the luminaire 30 through the USB receptacle 102.

Also, at step S220, a control message may be interpreted at step S222.

That is, at step S222, a result of interpretation of a message may be generated based on a USB-based control message sent and received between the host system 10 and the luminaire 30. Here, at step S222, a control message extracted from USB data, which are sent to and received from the host system 10 through the USB plug 101, and which are sent to and received from the luminaire through the USB receptacle 102, is interpreted, whereby a result of interpretation of the message may be generated.

Here, at step S222, whether a control message is received may be checked at sub-step S223.

That is, when it is determined at step S223 that a control message is received by the luminaire-testing apparatus 100, a result of interpretation of the message may be generated at step S224 based on the received control message.

Here, when it is determined at step S223 that no control message is received by the luminaire-testing apparatus 100, a result of interpretation of the message may not be generated.

Also, at step S220, a result of measurement of illuminance may be received at step S225.

That is, at step S225, the result of measuring the illuminance of the luminaire 30, which is measured by the light reception device 40, may be received.

Also, at step S220, test result information may be generated at step S226.

That is, at step S226, test result information may be generated based on the test start command, the result of measurement of power consumption, the result of interpretation of the message, and the result of measurement of illuminance. The test result information may include the test start time information and the result of measurement of power consumption, the result of interpretation of the control message, and the result of measurement of illuminance corresponding to the test start time information. The test start time may be the time at which the test start command is received.

Here, at step S226, the test result information may be generated such that the test start time information, the result of measurement of power consumption, the result of interpretation of the message, and the result of measurement of illuminance are displayed on the screen of the interface of the user terminal device 50.

Here, at step S226, the test result information may be generated such that the test start time information, the result of measurement of power consumption, the result of interpretation of the message, and the result of measurement of illuminance are simultaneously displayed on a single screen of the interface of the user terminal device 50.

Here, at step S226, the test result information may be generated based on a communication method corresponding to the communication method of the user terminal device 50.

Also, in the method for testing a USB-based luminaire, the test result information may be sent at step S230.

That is, at step S230, the test result information may be sent to the user terminal device 50 in a wired or wireless manner. When a connection is made in a wired manner, the luminaire-testing apparatus may communication with the user terminal device 50 using a communication cable. When a connection is made in a wireless manner, the luminaire-testing apparatus may communicate with the user terminal device 50 using any of various wireless communication standards such as wireless USB, wireless Ethernet, CAN, Wi-Fi, ZigBee, Z-Wave, Bluetooth, or the like.

Also, in the method for testing a USB-based luminaire, the test result information may be output at step S240.

That is, at step S240, the test start time information, the result of measurement of power consumption, the result of interpretation of the message, and the result of measurement of illuminance, included in the test result information, may be output through the interface of the user terminal device 50. Here, the user terminal device 50 may be a terminal device including an input/output interface, such as a desktop PC, a laptop, a smartphone, or the like.

Here, at step S240, the test start time information, the result of measurement of power consumption, the result of interpretation of the message, and the result of measurement of illuminance may be simultaneously displayed on a single screen of the interface of the user terminal device 50, and information that changes in real time may be incorporated.

Figure 5:
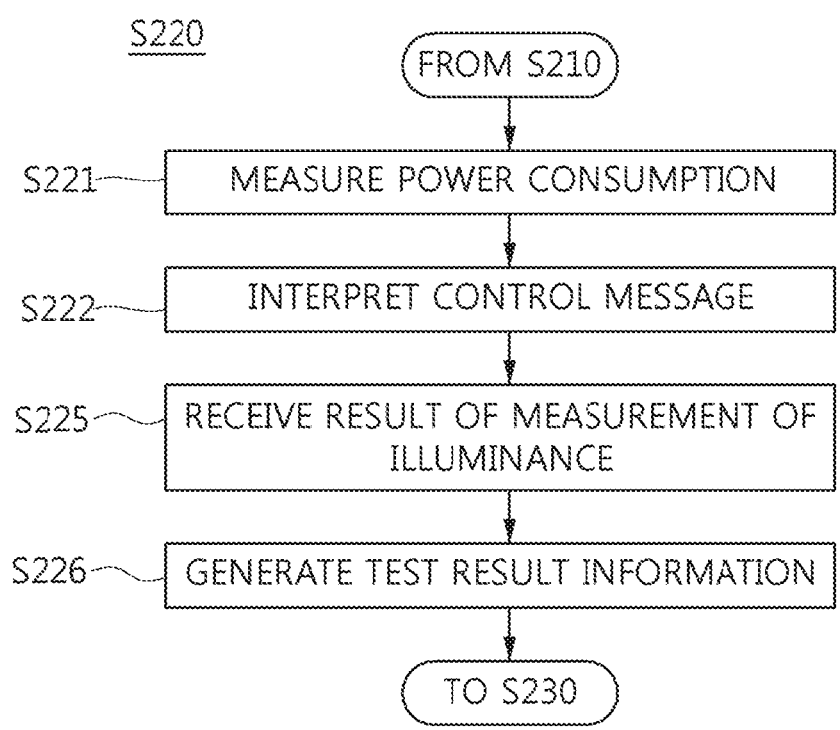
FIG. 5 is a flowchart that specifically shows an example of the step of generating test result information, illustrated in FIG. 4.

FIG. 5 is a flowchart that specifically shows an example of the step of generating test result information, illustrated in FIG. 4.

Referring to FIG. 5, at step S220, first, power consumption may be measure at step S221.

Here, at step S221, power consumption may be measured by measuring the power input from the host system 10 to the luminaire 30. Here, at step S221, the power consumption may be measured based on the voltage and current that are supplied from the host system 10 through the USB plug 101 and are then input to the luminaire 30 through the USB receptacle 102.

Also, at step S220, a control message may be interpreted at step S222.

That is, at step S222, a result of interpretation of a message may be generated based on a USB-based control message, sent and received between the host system 10 and the luminaire 30. Here, at step S222, a control message extracted from USB data, which are sent to and received from the host system 10 through the USB plug 101, and which are sent to and received from the luminaire through the USB receptacle 102, is interpreted, whereby a result of interpretation of the message may be generated.

Here, at step S222, whether a control message is received may be checked at sub-step S223.

That is, when it is determined at step S223 that a control message is received by the luminaire-testing apparatus 100, a result of interpretation of the message may be generated at step S224 based on the received control message.

Here, when it is determined at step S223 that no control message is received by the luminaire-testing apparatus 100, a result of interpretation of the message may not be generated.

Also, at step S220, a result of measurement of illuminance may be received at step S225.

That is, at step S225, the result of measuring the illuminance of the luminaire 30, which is measured by the light reception device 40, may be received.

Also, at step S220, test result information may be generated at step S226.

That is, at step S226, test result information may be generated based on the test start command, the result of measurement of power consumption, the result of interpretation of the message, and the result of measurement of illuminance. The test result information may include the test start time information and the result of measurement of power consumption, the result of interpretation of the control message, and the result of measurement of illuminance corresponding to the test start time information. The test start time may be the time at which the test start command is received.

Here, at step S226, the test result information may be generated such that the test start time information, the result of measurement of power consumption, the result of interpretation of the message, and the result of measurement of illuminance are displayed on the screen of the interface of the user terminal device 50.

Here, at step S226, the test result information may be generated such that the test start time information, the result of measurement of power consumption, the result of interpretation of the message, and the result of measurement of illuminance are simultaneously displayed on a single screen of the interface of the user terminal device 50.

Here, at step S226, the test result information may be generated based on a communication method corresponding to the communication method of the user terminal device 50.

Figure 6:
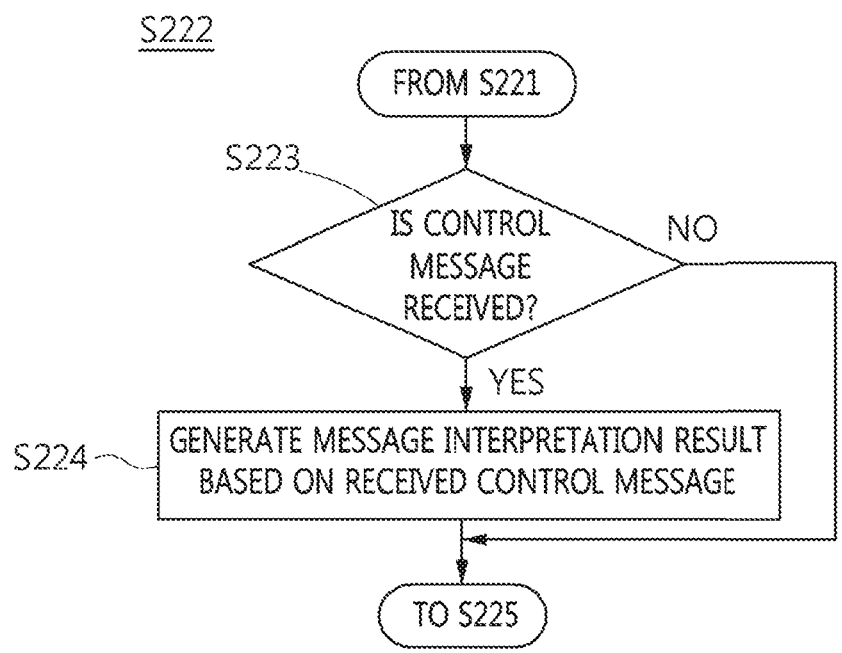
FIG. 6 is a flowchart that specifically shows an example of the step of interpreting a control message, illustrated in FIG. 5.

FIG. 6 is a flowchart that specifically shows an example of the step of interpreting a control message, illustrated in FIG. 5.

Referring to FIG. 6, whether a control message is received may be checked at step S223.

That is, when it is determined at step S223 that a control message is received by the luminaire-testing apparatus 100, a result of interpretation of the message may be generated at step S224 based on the received control message.

Here, when it is determined at step S223 that no control message is received by the luminaire-testing apparatus 100, a result of interpretation of the message may not be generated.

Figure 7:
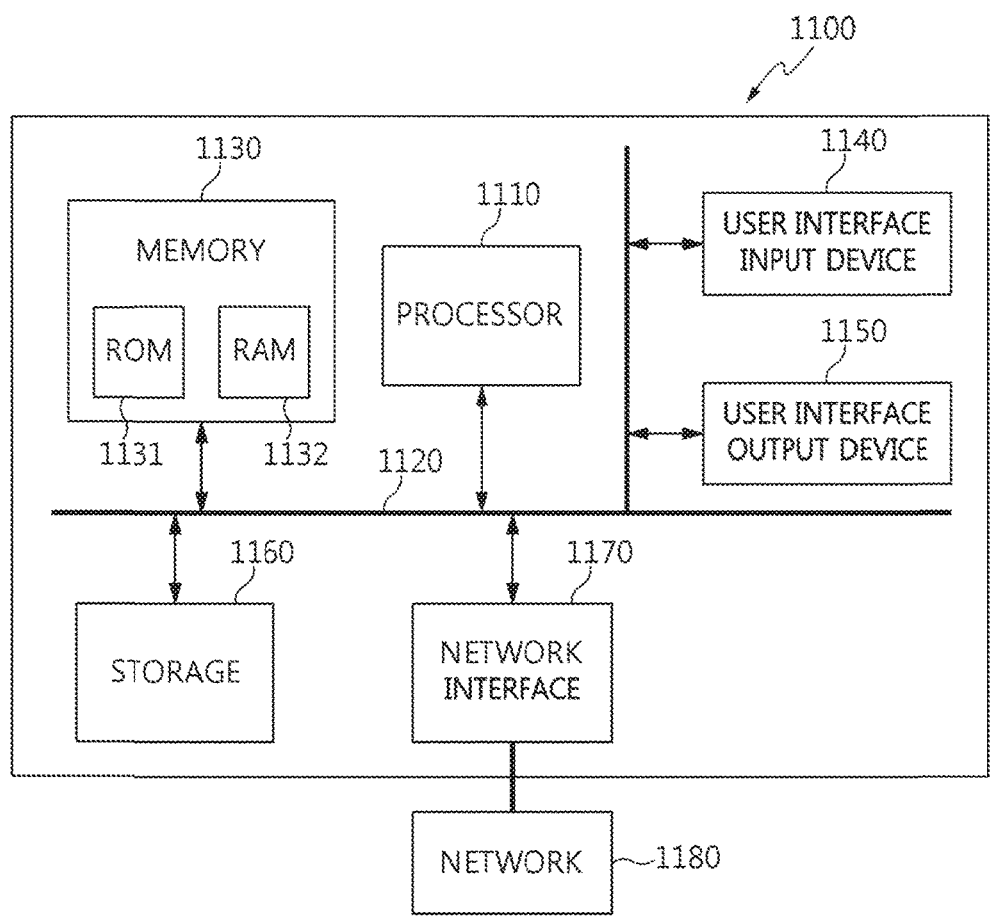
FIG. 7 is a block diagram that shows a computer system according to an embodiment of the present invention.

FIG. 7 is a block diagram that shows a computer system according to an embodiment of the present invention.

Referring to FIG. 7, an embodiment of the present invention may be implemented in a computer system 1100 such as a computer-readable recording medium. As illustrated in FIG. 7, the computer system 1100 may include one or more processors 1110, memory 1130, a user interface input device 1140, a user interface output device 1150, and storage 1160, which communicate with each other via a bus 1120. Also, the computer system 1100 may further include a network interface 1170 connected with a network 1180. The processor 1110 may be a central processing unit or a semiconductor device for executing processing instructions stored in the memory 1130 or the storage 1160. The memory 1130 and the storage 1160 may be different forms of volatile or non-volatile storage media. For example, the memory may include ROM 1131 or RAM 1132.

The present invention may simultaneously perform the measurement of power consumption, the interpretation of a control message, and the measurement of illuminance of a USB-based luminaire connected with a host system.

Also, the present invention may incorporate the state of a luminaire, changed based on a control message, in a test result in real time.

Also, the present invention may simultaneously display the test start time, power consumption, the result of interpretation of a message, and the result of measurement of illuminance on a single screen through an interface of a user terminal device.

As described above, the apparatus and method for testing a USB-based luminaire according to the present invention are not limitedly applied to the configurations and operations of the above-described embodiments, but all or some of the embodiments may be selectively combined and configured, so that the embodiments may be modified in various ways.

What is claimed is:

1. An apparatus for testing a luminaire based on a universal serial bus (USB), comprising:
a power measurement unit for measuring power consumption by measuring power input from a host system to a luminaire based on the USB;
a message interpretation unit for generating a result of interpretation of a message based on a USB-based control message sent and received between the host system and the luminaire;
an illuminance reception unit for receiving a result of measurement of illuminance of the luminaire, measured by a light reception device; and
an information generation unit for generating test result information based on a result of the measurement of the power consumption, the result of the interpretation of the message, and the result of the measurement of the illuminance;
wherein the apparatus for testing the luminaire further comprises:
a USB plug including a detachable USB plug-fixing unit for connecting to the host system which have one of defined USB port types;
a USB receptacle including a detachable USB receptacle-fixing unit for connecting to the luminaire which have one of defined USB connector types;
an external power supply connection unit for receiving power from an external power supply;

wherein the apparatus for testing the luminaire is driven by using power received from the external power supply and passes power supplied from the host system to the luminaire.

2. The apparatus of claim 1, wherein the message interpretation unit generates the result of the interpretation of the message by interpreting the control message extracted from USB data, which are sent to and received from the host system through the USB plug, and which are sent to and received from the luminaire through the USB receptacle.

3. The apparatus of claim 2, wherein the information generation unit collects the result of the measurement of the power consumption, the result of the interpretation of the message, and the result of the measurement of the illuminance corresponding to test start time information based on a test start command received from a user terminal device.

4. The apparatus of claim 3, wherein the information generation unit generates the test result information such that the test start time information, the result of the measurement of the power consumption, the result of the interpretation of the message, and the result of the measurement of the illuminance are displayed on a screen of an interface of the user terminal device.

5. The apparatus of claim 4, wherein the information generation unit generates the test result information based on a communication method corresponding to a communication method of the user terminal device.

6. A method for testing a luminaire based on a universal serial bus (USB), in which an apparatus for testing a luminaire based on USB is used, comprising:
measuring power consumption by measuring power input from a host system to a luminaire based on the USB;
generating a result of interpretation of a message based on a USB-based control message sent and received between the host system and the luminaire;
receiving a result of measurement of illuminance of the luminaire, measured by a light reception device; and
generating test result information, within the apparatus, based on a result of the measurement of the power consumption, the result of the interpretation of the message, and the result of the measurement of the illuminance;
wherein the apparatus for testing the luminaire comprises:
a USB plug including a detachable USB plug-fixing unit for connecting to the host system which have one of defined USB port types;
a USB receptacle including a detachable USB receptacle-fixing unit for connecting to the luminaire which have one of defined USB connector types;
an external power supply connection unit for receiving power from an external power supply;
wherein the apparatus for testing the luminaire is driven by using power received from the external power supply and passes power supplied from the host system to the luminaire.

7. The method of claim 6, wherein generating the result of the interpretation of the message is configured to generate the result of the interpretation of the message by interpreting the control message extracted from USB data, which are sent to and received from the host system through the USB plug, and which are sent to and received from the luminaire through the USB receptacle.

8. The method of claim 7, wherein generating the test result information is configured to collect the result of the measurement of the power consumption, the result of the interpretation of the message, and the result of the measurement of the illuminance corresponding to test start time information based on a test start command received from a user terminal device.

9. The method of claim 8, wherein generating the test result information is configured to generate the test result information based on a communication method corresponding to a communication method of the user terminal device.

10. The method of claim 9, wherein generating the test result information is configured to display the test start time information, the result of the measurement of the power consumption, the result of the interpretation of the message, and the result of the measurement of the illuminance on a screen of an interface of the user terminal device.

* * * * *